(12) United States Patent
Bajaj et al.

(10) Patent No.: US 6,888,385 B2
(45) Date of Patent: May 3, 2005

(54) PHASE LOCKED LOOP (PLL) FOR INTEGRATED CIRCUITS

(75) Inventors: Rajesh Bajaj, New Delhi (IN); Nipun Padha, Up (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 0 days.

(21) Appl. No.: 10/639,248

(22) Filed: Aug. 12, 2003

(65) Prior Publication Data

US 2004/0104750 A1 Jun. 3, 2004

(30) Foreign Application Priority Data

Aug. 12, 2002 (IN) .............................................. 836/2002

(51) Int. Cl.$^7$ ................................................. H03L 7/06
(52) U.S. Cl. ....................................... 327/147; 327/156
(58) Field of Search ................................. 327/147, 149, 327/155, 156, 158; 331/17, 25; 375/373, 375, 376

(56) References Cited

U.S. PATENT DOCUMENTS

| 6,023,180 | A | | 2/2000 | Schmidt ...................... 327/270 |
| 6,326,812 | B1 | * | 12/2001 | Jefferson ...................... 326/93 |
| 6,718,477 | B1 | * | 4/2004 | Plants et al. ................. 713/500 |
| 6,762,629 | B2 | * | 7/2004 | Tam et al. ................... 327/114 |

* cited by examiner

*Primary Examiner*—Linh My Nguyen
(74) *Attorney, Agent, or Firm*—Graybeal Jackson Haley LLP

(57) ABSTRACT

An improved Phase Locked Loop (PLL) for digital integrated circuits. A characteristic of this PLL is that the Voltage Controlled Oscillator (VCO) output is fed to the phase and frequency detector (PFD) input through a clock-tree replica providing a delay equal to the routed clock tree. "This enables the PLL to maintain the proper phase even during a sleep mode of operation."

22 Claims, 5 Drawing Sheets

PHASE LOCKED LOOP (PLL) FOR INTEGRATED CIRCUITS

PRIORITY CLAIM

This application claims priority from Indian patent application No. 836/Del/2002, filed Aug. 12, 2002, which is incorporated herein by reference.

TECHNICAL FIELD

This invention relates generally to an improved electronic phase locked Loop (PLL) for integrated circuits.

BACKGROUND

Phase Locked Loops (PLLs) are widely used for synchronizing digital clock signals. Digital integrated circuits make use of PLLs in compensating for internal signal-to-signal delays also known as "skews". Skew compensations are often critical to the functioning of the circuit, especially when fast clock speeds are involved. The clock signal in high-speed synchronous digital integrated circuits is particularly sensitive to skews, and a great deal of attention is therefore paid to skew compensations in the distribution of this signal. In addition, the internal clock is generally required to be synchronized to an external clock source. Large integrated circuits make of clock tree structures to provide a structured and balanced distribution of the clock across the device.

The internal delays of signals in integrated circuits arise from delays contributed by circuit elements as well as delay contributed by the physical path traversed by the signal. Signal path delays are significantly influenced by the physical layout of the device. In signal skew compensation applications it is therefore necessary for the PLL to map the internal signal delays of the two signals to be synchronized. As the signal delays are dependant on the physical layout, the mapping is layout dependant. The design of the PLL block in the integrated circuit is therefore delayed until the rest of the device has been completed. Considering the importance of reducing the development cycle time for integrated circuits it would be desirable to have a mechanism that could enable the PLL design to overlap the design of the remainder of the device.

PLL operation requires a continuous operation of the clock sources that are required to be synchronized. In the conventional practice when there is no SLEEP modes in a circuit, the point chosen for the feedback is at the leaf of the clock tree as shown in FIG. 1 of the accompanying drawings. But for the circuits with sleep mode as shown in FIG. 2 of the accompanying drawings, during the sleep mode the clock terminates from point 206 onwards, which in turn makes the feedback loop ineffective, as there is no signal activity at point 208. A detailed description of FIGS. 1 and 2 has been given below after the description of the accompanying drawings.

U.S. Pat. No. 6,023,180 discloses a clock compensation circuit, which provides a PLL circuit without utilizing any analog circuitry (e.g. VCO etc.). In this patent, the digital components available in any Application Specific Integrated Chip (ASIC) vendor's library are utilized for realization of the equivalent PLL functions. The disclosed PLL includes a clock tree, a reference clock, a phase detector for detecting relative phase information of the clock tree and the reference clock, a controller coupled to the phase detector for determining and controlling the amount of delay necessary to shift the output of the clock tree in phase with the reference clock, and a programmable delay logic coupled to the controller. The programmable delay logic comprises a string of delay elements that selectively determine the amount of delay introduced. This patent also discloses providing the feedback to the PLL from the point at a leaf cell, and hence this PLL is unable to function during SLEEP mode of the circuit.

SUMMARY

One embodiment of the invention provides an improved PLL circuit that functions effectively even during SLEEP modes of operation.

Another embodiment of this invention enables a faster design cycle by enabling a semi custom design approach that provides for basic design of the PLL circuitry in parallel with the design of the remaining circuitry with final adjustments being possible in a short period of time at the end of the design cycle.

Yet another embodiment of the invention provides an improved Phase Locked Loop (PLL) for a digital integrated circuit, the PLL comprising:

a Phase and Frequency Detector (PFD) connected to a Voltage Controlled Oscillator (VCO) providing a clock output, a routed clock tree connected between said VCO and a leaf cell and a frequency divider in the feedback path to the PFD input, characterized in that, the VCO output is fedback to the PFD input through a clock tree replica providing a delay equal to the routed clock tree.

The PLL may further include selection means connected between VCO and routed clock tree for disabling the PLL output during SLEEP mode.

The selection means may be an AND gate.

The clock tree replica may be an accurate representation of the on-chip clock tree branch that is required to be driven by the clock signal.

The routed clock tree may be implemented by using a semi custom design approach where a netlist replicates the on-chip clock tree with the help of automatic placement, clock tree synthesis, and routing tools to achieve the desired delays.

Another embodiment of this invention provides an improved Phase Locked Loop (PLL) for a digital integrated circuit comprising the steps of:

providing a Phase and Frequency Detector (PFD) for comparing the input clock and the generated clock, connecting a Voltage Controlled Oscillator (VCO) at the output of the PFD for producing a clock output and a frequency divider in the feedback path to the PFD input, characterized in that the VCO output is fedback to the PFD input through a clock tree replica providing a delay equal to the routed clock tree.

The above method may further provide disabling the PLL output during SLEEP mode by coupling a selection means between the VCO output and the PLL output.

The routed clock tree may be implemented by using a semi custom design approach in which a netlist replicates the on-chip clock tree with the help of automatic placement, clock tree synthesis, and routing tools to achieve the desired delays.

BRIEF DESCRIPTION OF THE DRAWINGS

Embodiments of the invention will now be described with reference to the accompanying drawings.

DETAILED DESCRIPTION

Figure 1:
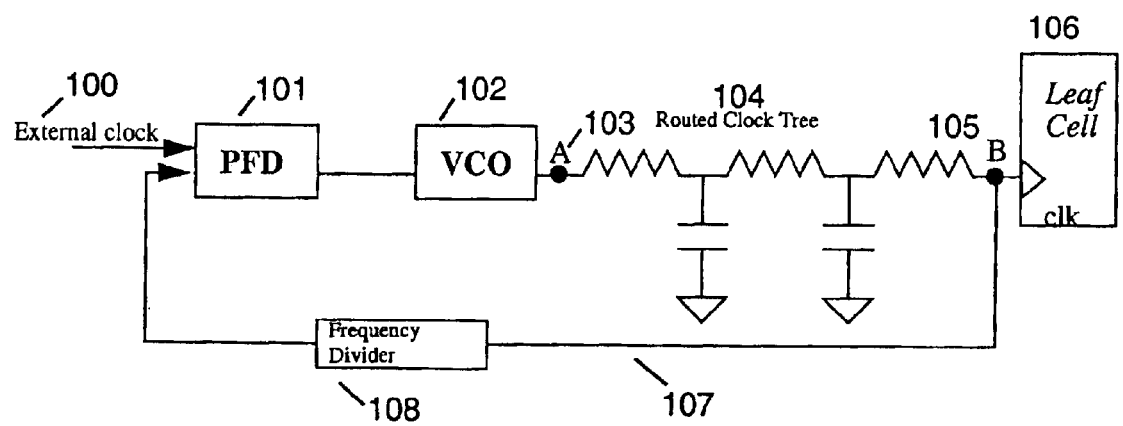
FIG. 1 shows the schematic diagram of a conventional PLL circuit without the SLEEP mode.

FIG. 1 shows a conventional PLL circuit for an electronic device without the SLEEP mode. An external clock 100 is fed to the phase and frequency detector PFD 101, which connects to the Voltage Controlled Oscillator VCO 102. The output A 103 of the VCO 102 connects to the leaf 106 of the clock tree Leaf Cell 106 through the routed clock tree 104. The routed clock tree 104 within the design is selected to provide a feedback loop to correct phase difference between the external system clock and the internal clock. Point B 105 where the routed clock tree net terminates is fed back to the PFD 101 through the frequency divider 108. The main drawback of this circuit lies in the selection of the clock-tree termination point on which the entire feed back loop is dependent.

Figure 2:
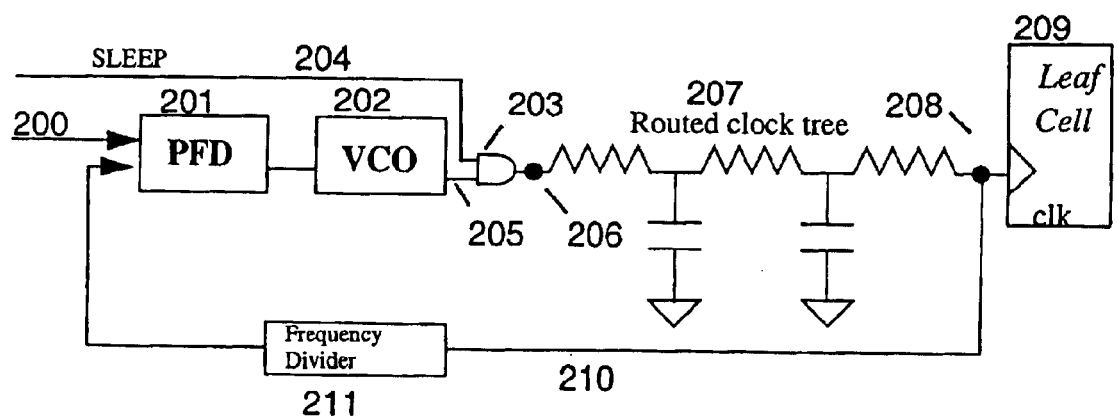
FIG. 2 shows the schematic diagram of a conventional PLL circuit with the SLEEP mode.

FIG. 2 shows the schematic diagram of a conventional PLL circuit with SLEEP mode 204. In this circuit, a deselect means 203 is introduced for deselecting the routed clock tree. In the present example, an AND gate 203 is introduced between the routed clock tree 207 and the Voltage Controlled Oscillator VCO 202, such that one of the inputs of AND gate 203 is used to select the SLEEP mode, while the second input 205 of the AND gate is the output of VCO 202. In this case, when the circuit is in SLEEP mode, the clock is terminated from point 206 onwards making the feedback loop ineffective, as there is no signal activity at point 208.

Figure 3:
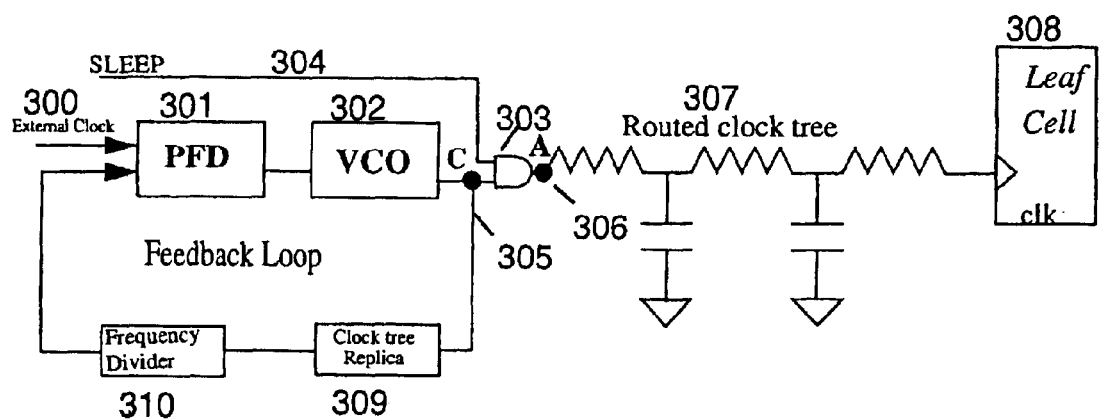
FIG. 3 shows the schematic diagram of a PLL circuit with SLEEP mode according to an embodiment of this invention

An embodiment of the present invention is explained in FIG. 3. In this figure, an external clock 300 is fed to the phase and frequency detector PFD 301, which connects to the Voltage Controlled Oscillator VCO 302. The output C 305 of the VCO 302 connects to the selection means (here, AND gate 303) and the output of the selection means is connected to the leaf cell 308 through the routed clock tree 307. The output 305 of the VCO 302 is selected to provide a feedback loop to correct the phase difference between the external system clock and the internal clock through the clock-tree replica 309 joining the optional frequency divider 310 to the phase and frequency detector 301, the clock tree replica providing a delay equal to the routed clock tree.

The clock-tree replica 309 is inserted in the feedback loop along with frequency divider so that when the circuit is in sleep mode, i.e., the clock signal is terminated from point A onwards, the PLL circuit can still function to keep the clock in phase. The input and output pins of the clock-tree replica 309 are strategically placed in the layout so as to minimize routing delay.

Figure 4:
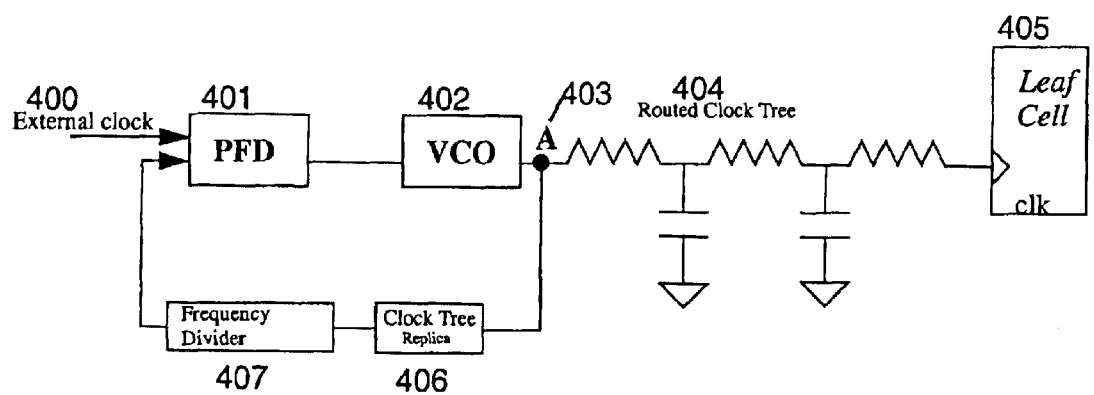
FIG. 4 shows the schematic diagram of a PLL circuit without SLEEP mode according to an embodiment of this invention.

FIG. 4 shows another possible embodiment of the PLL circuit without SLEEP mode. The output of the Voltage Controlled Oscillator VCO 402 is fed back to the phase and frequency detector 401 through the clock-tree replica 406 and the optional frequency divider 407.

Figure 5:
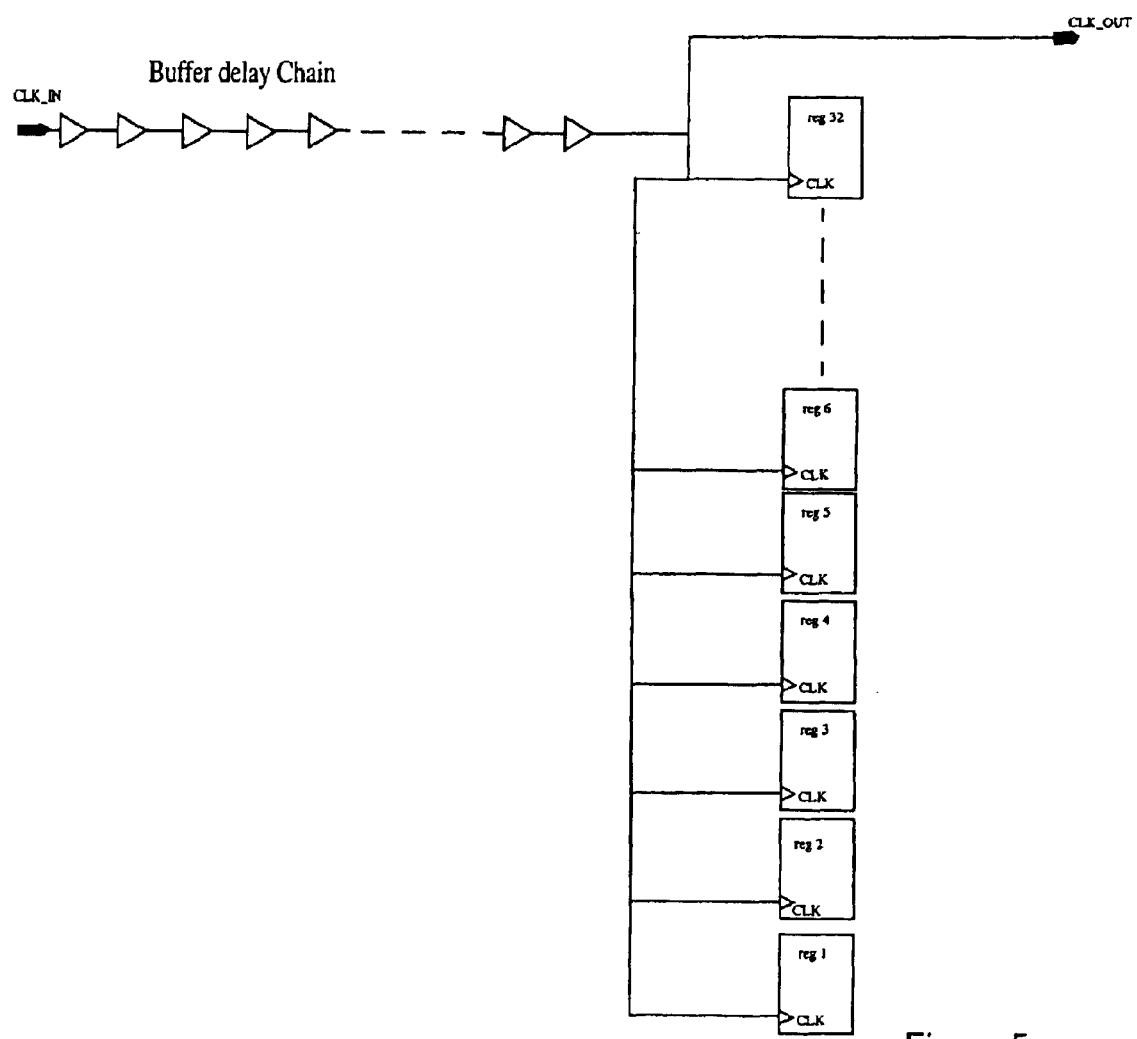
FIG. 5 shows one of the possible methods to realize the clock tree replica according to an embodiment of the invention.

FIG. 5 shows one of the possible methods for realizing the clock-tree replica 309. The delay module viz. clock tree-replica 309 is implemented by using a semi-custom design approach where a netlist replicates the on-chip clock tree with the help of automatic placement, clock-tree synthesis, and routing tools. The method uses a set of registers whose clock pins CLK are connected to top-level pin CLK_IN and the input pin (not shown) is tied to logic level high. The output pin is purposely left unconnected, as there is no data flow through the circuit. After clock-tree synthesis, routing of the CLK_IN node is carefully selected to minimize routing delay, and the CLK_IN node is connected to the CLK_OUT of the module. The flip-flops (registers) and clock-tree buffers used are the same type as used in the actual on chip clock tree, making the clock-tree replica an accurate replica of the on-chip clock tree branch, thereby providing an effective control over insertion delay of this branch. Any shift in the clock-tree delay due to process voltage, temperature (PVT) conditions would affect this replica branch in the same way as it affects the on-chip clock tree delay. The output 305 of the VCO 302 (as shown in FIG. 3) and the output 403 of the VCO 402 (as shown in FIG. 4) are selected to provide a feedback loop to correct the phase difference between the external system clock and the internal clock.

The PLLs of FIGS. 3 and 4 may be incorporated into an integrated circuit (IC) such as a processor, and the IC may be incorporated into a system such as a computer system.

It will be apparent to those with ordinary skill in the art that the foregoing is merely illustrative, and is not intended to be exhaustive or limiting, having been presented by way of example only and that various modifications can be made within the scope of the above invention. For instance, the number of series-connected buffers and parallel-connected registers can be varied. Similarly, the intermediate voltage levels can be different from what has been described. Accordingly, this invention is not to be considered limited to the specific examples chosen for purposes of disclosure, but rather to cover all changes and modifications. The invention is therefore not limited by the description contained herein or by the drawings.

What is claimed is:

1. An improved Phase Locked Loop (PLL) for a digital integrated circuit comprising:
    a routed clock tree connected between a VCO and a leaf cell,
    a frequency divider in a feedback path to a PFD input,
    wherein the VCO output is fedback through the feedback path to the PFD input, the feedback path including a clock tree replica coupled to the VCO output for providing a delay equal to the routed clock tree and the feedback path including the frequency divider coupled to the clock tree replica and directly coupled to the PFD input.

2. An improved PLL as claimed in claim 1 further comprising a selection means connected between VCO and routed clock tree for disabling the PLL output during SLEEP mode.

3. An improved PLL as claimed in claim 2 wherein the selection means is an AND gate.

4. An improved PLL as claimed in claim 1, wherein the clock tree replica is an accurate representation of the on-chip clock tree branch that is required to be driven by a clock signal.

5. An improved Phase Locked Loop (PLL) for a digital integrated circuit comprising:
    a routed clock tree connected between a VCO and a leaf cell and a frequency divider in a feedback path to a PFD input, wherein the VCO output is fedback to the PFD input through a clock tree replica providing a delay equal to the routed clock tree, and wherein the routed clock tree is implemented by using a semi custom design approach where a netlist replicates the on-chip clock tree with the help of automatic placement, clock tree synthesis, and routing tools to achieve the desired delays.

6. A method for providing an improved Phase Locked Loop (PLL) for a digital integrated circuit, comprising:

providing a Phase and Frequency Detector (PFD) for comparing an input clock and a generated clock, connecting a Voltage Controlled Oscillator (VCO) at an output of the PFD for producing a clock output, connecting a frequency divider in a feedback path to an input of the PFD that receives the generated clock, and wherein a VCO output is fedback through a clock tree replica providing a delay equal to a routed clock tree and then through the frequency divider to the input of the PFD that receives the generated clock, with the clock tree replica and the frequency divider forming the feedback path.

7. A method as claimed in claim 6 further comprising disabling the PLL output during SLEEP mode by coupling a selection means between the VCO output and the PLL output.

8. A method for providing an improved Phase Locked Loop (PLL) for a digital integrated circuit, comprising:

providing a Phase and Frequency Detector (PFD) for comparing an input clock and a generated clock, connecting a Voltage Controlled Oscillator (VCO) at an output of the PFD for producing a clock output, connecting a frequency divider in a feedback path to an input of the PFD that receives the generated clock, wherein a VCO output is feedback through a clock tree replica providing a delay equal to a routed clock tree and through the frequency divider to the input of the PFD that receives the generated clock, with the clock tree replica and the frequency divider forming the feedback path, and wherein the routed clock tree is implemented by using a semi custom design approach in which a netlist replicates the on-chip clock tree with the help of automatic placement, clock tree synthesis, and routing tools to achieve the desired delays.

9. A phase-locked loop, comprising:

a phase detector operable to generate an error signal that is related to a phase difference between a reference signal and a delayed output signal;

a signal-controlled oscillator coupled to the phase detector and operable to generate an output signal having a frequency that is related to the error signal; and a feedback circuit coupled to the phase detector and to the oscillator and operable to generate the delayed output signal by first delaying the output signal from the oscillator by a delay time that is substantially equal to a delay time that the output signal is delayed in propagating from the oscillator to a remote circuit node and by thereafter dividing the frequency of the output signal that has been delayed by the delay time that is substantially equal to the delay time that the output signal is delayed in propagating from the oscillator to a remote circuit node.

10. The phase-locked loop of claim 9, further comprising a disable circuit operable to uncouple the output signal from the remote circuit during a sleep mode.

11. The phase-locked loop of claim 9 wherein the reference signal, output signal, and delayed output signal respectively comprise a reference clock, an output clock, and a delayed output clock.

12. The phase-locked loop of claim 9, further comprising a frequency divider coupled to the phase detector and to the feedback circuit and operable to reduce the frequency of the delayed output signal.

13. An integrated circuit, comprising:

a circuit;

a delay path having an output node coupled to the circuit, an input node, and a signal delay; and a phase-locked loop having an output node coupled to the input node of the delay path, the phase-locked loop comprising, a phase detector operable to generate an error signal that is related to a phase difference between a reference signal and a delayed output signal, a signal-controlled oscillator coupled to the phase detector and operable to generate on the output node of the oscillator an output signal having a frequency that is related to the error signal, and a feedback circuit coupled to the phase detector and to the oscillator and operable to generate the delayed output signal by first delaying the output signal from the oscillator by the signal delay to generate a model output signal and by thereafter dividing a frequency of the model output signal.

14. The integrated circuit of claim 13 wherein the feedback circuit comprises a substantial replica of the delay path.

15. The integrated circuit of claim 13 wherein the delay path comprises a clock tree.

16. The integrated circuit of claim 13 wherein:

the delay path comprises a clock tree; and the circuit comprises a leaf cell of the clock tree.

17. An electronic system, comprising:

an integrated circuit, comprising, a circuit, a delay path having an output node coupled to the circuit, an input node, and a signal delay, and a phase-locked loop having an output node coupled to the input node of the delay path, the phase-locked loop comprising, a phase detector operable to generate an error signal that is related to a phase difference between a reference signal and a delayed output signal, a signal-controlled oscillator coupled to the phase detector and operable to generate on the output node of the oscillator an output signal having a frequency that is related to the error signal, and a feedback circuit coupled to the phase detector and to the oscillator and operable to generate the delayed output signal by first delaying the output signal from the oscillator by the signal delay to generate a model output signal and by thereafter dividing a frequency of the model output signal.

18. A method of controlling a phase-locked loop, comprising:

generating an error signal that is related to a phase difference between a reference signal and a delayed output signal;

generating an output signal having a frequency that is related to the error signal; and generating the delayed output signal by delaying the output signal substantially by a same delay time that the output signal is delayed along a path to a circuit that receives the output signal and thereafter dividing the frequency of this signal.

19. The method of claim 18, further comprising reducing the frequency of the delayed output signal before generating the error signal.

20. A method of controlling a phase-locked loop, comprising:

designing a circuit having a delay; and replicating the delay of the circuit;

delaying an output signal applied to the circuit by the replicated delay to generate a model delayed signal;

after generating the model delayed signal, dividing a frequency of the model delayed signal to generate an adjusted output signal;

adjusting a frequency of an output signal applied to the circuit as a function of the phase difference between the adjusted output signal and an input signal.

21. The method of claim 20 wherein:

designing the circuit comprises generating a software representation of the circuit; and replicating the circuit comprises replicating the software representation of the circuit.

22. The method of claim 20 wherein the circuit comprises a clock tree.

* * * * *